(12) United States Patent
Schnappenberger et al.

(10) Patent No.: US 10,818,475 B2
(45) Date of Patent: Oct. 27, 2020

(54) AC POWER CONNECTOR, SPUTTERING APPARATUS AND METHOD THEREFOR

(71) Applicants: Frank Schnappenberger, Johannesberg (DE); Anke Hellmich, Kahl (DE); Stefan Keller, Mainaschaff (DE); Marcus Bender, Hanau (DE)

(72) Inventors: Frank Schnappenberger, Johannesberg (DE); Anke Hellmich, Kahl (DE); Stefan Keller, Mainaschaff (DE); Marcus Bender, Hanau (DE)

(73) Assignee: APPLIED MATERIALS, INC., Santa Clara, CA (US)

( * ) Notice: Subject to any disclaimer, the term of this patent is extended or adjusted under 35 U.S.C. 154(b) by 294 days.

(21) Appl. No.: 15/105,894

(22) PCT Filed: Dec. 18, 2013

(86) PCT No.: PCT/EP2013/077106
§ 371 (c)(1),
(2) Date: Jun. 17, 2016

(87) PCT Pub. No.: WO2015/090380
PCT Pub. Date: Jun. 25, 2015

(65) Prior Publication Data
US 2016/0336151 A1  Nov. 17, 2016

(51) Int. Cl.
*H01J 37/34* (2006.01)
*H01J 37/32* (2006.01)
(Continued)

(52) U.S. Cl.
CPC .... *H01J 37/32183* (2013.01); *C23C 14/3407* (2013.01); *H01G 5/12* (2013.01);
(Continued)

(58) Field of Classification Search
CPC ........ C23C 14/3407; H01G 5/12; H01G 5/04; H01J 37/32183; H01J 37/32577;
(Continued)

(56) References Cited

U.S. PATENT DOCUMENTS

| 6,155,202 A | 12/2000 | Nakano et al. |
| 2005/0001490 A1 | 1/2005 | Weiler et al. |

(Continued)

FOREIGN PATENT DOCUMENTS

| CN | 102822381 A | 12/2012 |
| JP | S60-152674 U | 10/1985 |

(Continued)

OTHER PUBLICATIONS

Machine Translation JP 07-078729 dated Mar. 1995. (Year: 1995).*

(Continued)

*Primary Examiner* — Rodney G McDonald
(74) *Attorney, Agent, or Firm* — Patterson + Sheridan LLP

(57) ABSTRACT

An AC power connector for connecting an AC power supply with a device is provided. The AC power connector includes at least one first element connectable with the AC power supply and at least one second element connectable with the device, the first element and the second elements being arranged at a first distance with respect to each other for defining a capacitance, wherein the at least one first element and the at least one second element are rotatable with respect to each other, wherein the first element and the second element are configured for a transfer of an AC power between the at least one first element and the at least one second element.

22 Claims, 4 Drawing Sheets

(51) Int. Cl.
   *H01G 5/12*   (2006.01)
   *C23C 14/34*  (2006.01)
   *H03H 7/00*   (2006.01)
   *H01G 5/04*   (2006.01)
(52) U.S. Cl.
   CPC .... *H01J 37/32577* (2013.01); *H01J 37/3405* (2013.01); *H01J 37/3435* (2013.01); *H01J 37/3444* (2013.01); *H03H 7/004* (2013.01); *H01G 5/04* (2013.01); *H01J 2237/20214* (2013.01); *H01J 2237/3322* (2013.01)
(58) Field of Classification Search
   CPC ............... H01J 37/3405; H01J 37/3435; H01J 37/3444; H01J 2237/20214; H01J 2237/3322; H03H 7/004
   USPC ............. 204/298.06, 298.08, 298.21, 298.22
   See application file for complete search history.

(56) References Cited

U.S. PATENT DOCUMENTS

| | | | |
|---|---|---|---|
| 2005/0061442 A1 | 3/2005 | Higashiura | |
| 2005/0139467 A1 | 6/2005 | Takahashi | |
| 2005/0264974 A1* | 12/2005 | Takahashi | H01G 5/014 361/277 |
| 2013/0194713 A1* | 8/2013 | Touchi | H05H 13/005 361/278 |

FOREIGN PATENT DOCUMENTS

| | | | |
|---|---|---|---|
| JP | 01305523 | | 12/1989 |
| JP | H05-198390 | A | 8/1993 |
| JP | 07-078729 | * | 3/1995 |
| JP | H11-162696 | | 6/1999 |
| JP | 2001-118700 | A | 4/2001 |
| JP | 2003-524286 | A | 8/2003 |
| JP | 2005-187830 | A | 7/2005 |
| JP | 2013-524015 | A | 6/2013 |
| TW | 200402252 | A | 2/2004 |
| TW | 201340149 | A | 10/2013 |
| WO | 2011123646 | | 10/2011 |
| WO | 2011123646 | A2 | 10/2011 |
| WO | 2013113401 | | 8/2013 |
| WO | 2013113401 | A1 | 8/2013 |
| WO | 2014/113401 | A1 | 7/2014 |

OTHER PUBLICATIONS

International Search Report and Written Opinion dated Oct. 10, 2014 for International Application No. PCT/EP2013/077106.
Carl Almgren, "RF measurements and their role in the manufacturing environment". Advanced Energy. Aug. 1997.

* cited by examiner

AC POWER CONNECTOR, SPUTTERING APPARATUS AND METHOD THEREFOR

TECHNICAL FIELD OF THE INVENTION

Embodiments of the present invention relate to an AC power connector, a sputtering apparatus and methods therefor. Embodiments specifically relate to an AC power connector for connecting an AC power supply with a device, a sputtering apparatus for sputter deposition in a vacuum chamber, and a method for providing AC power from an AC power supply to a device.

BACKGROUND OF THE INVENTION

PVD processes gain increasing attention in some technical fields, e.g. display manufacturing. A good deposition rate can be obtained with sufficient layer characteristics for some PVD processes. For example, sputtering is one important deposition process for display manufacturing or other applications. Sputtering, e.g. magnetron sputtering is a technique for coating substrates, e.g. glass or plastic substrates. Sputtering generates a stream of coating material by sputtering a target through the use of a plasma. During this a process in which material is released from the surface of the target by collision with high-energy particles from the plasma. Sputtering is controllable by plasma parameters, such as pressure, power, gas, and a magnetic field. In vacuum, the sputtered materials travel from the target toward one or more substrates or workpieces and adhere to the surface thereof. A wide variety of materials, including metals, semiconductors and dielectric materials can be sputtered to desired specifications. Magnetron sputtering has thus found acceptance in a variety of applications including semiconductor processing, optical coatings, food packaging, magnetic recording, and protective wear coatings.

Magnetron sputtering devices include a power supply for depositing energy into a gas to strike and maintain a plasma, magnetic elements for controlling the motion of ions, and targets for generating coating material through sputtering by the plasma. Sputtering is accomplished with a wide variety of devices having differing electrical, magnetic, and mechanical configurations. The configurations include sources of DC or AC electromagnetic fields or radio frequency energy to produce the plasma. Particularly, non-conductive materials may be sputtered using RF sputtering methods.

Many applications can be conducted with RF sputtering, for example sputtering of materials of low resistivity, for instance ITO, or materials which cannot be sputtered using DC or MF sputtering techniques, such as $SiO_2$, $Al_2O_3$, LiPON and PTFE. Further, typically rotatable targets are used. Due to geometry and design, rotatable targets have higher utilization and an increased operation time than planar ones. Further, rotatable targets avoid the occurrence of re-deposition zones. Accordingly, the use of rotatable targets typically prolongs service lives and reduces costs.

However, for RF sputtering using a rotatable target it is difficult to provide the power to the target. Thus, there is an ongoing need to improve AC feed-throughs, and particularly RF feed-throughs.

SUMMARY OF THE INVENTION

In light of the above, an AC power connector for connecting an AC power supply with a device, a sputtering apparatus for sputter deposition in a vacuum chamber, and a method for providing AC power from an AC power supply to a device according to the independent claims are provided. Further aspects, advantages, and features of the present invention are apparent from the dependent claims, the description, and the accompanying drawings.

According to one embodiment, an AC power connector for connecting an AC power supply with a device is provided. The AC power connector includes at least one first element connectable with the AC power supply and at least one second element connectable with the device, the first element and the second elements being arranged at a first distance with respect to each other for defining a capacitance, wherein the at least one first element and the at least one second element are rotatable with respect to each other, wherein the first element and the second element are configured for a transfer of an AC power between the at least one first element and the at least one second element.

According to another embodiment, a sputtering apparatus for sputter deposition in a vacuum chamber is provided. The sputtering apparatus includes a vacuum chamber having a wall portion; a rotatable target within the vacuum chamber; an AC power supply for providing AC power to the rotatable target; and an AC power connector provided in the wall portion, wherein the at least one first element is connected to the AC power supply and the at least one second element is connected to the rotatable target. The AC power connector includes at least one first element connectable with the AC power supply and at least one second element connectable with the device, the first element and the second elements being arranged at a first distance with respect to each other for defining a capacitance, wherein the at least one first element and the at least one second element are rotatable with respect to each other, wherein the first element and the second element are configured for a transfer of an AC power between the at least one first element and the at least one second element.

According to a further embodiment, a method for providing AC power from an AC power supply to a device is provided. The method includes transferring AC power from the power supply via at least one first element to at least one second element, wherein the at least one first element and the at least one second element are arranged at a first distance with respect to each other, and rotating at least one of the at least one first element and the at least one second element with respect to each other.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF EMBODIMENTS

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

Figure 1:
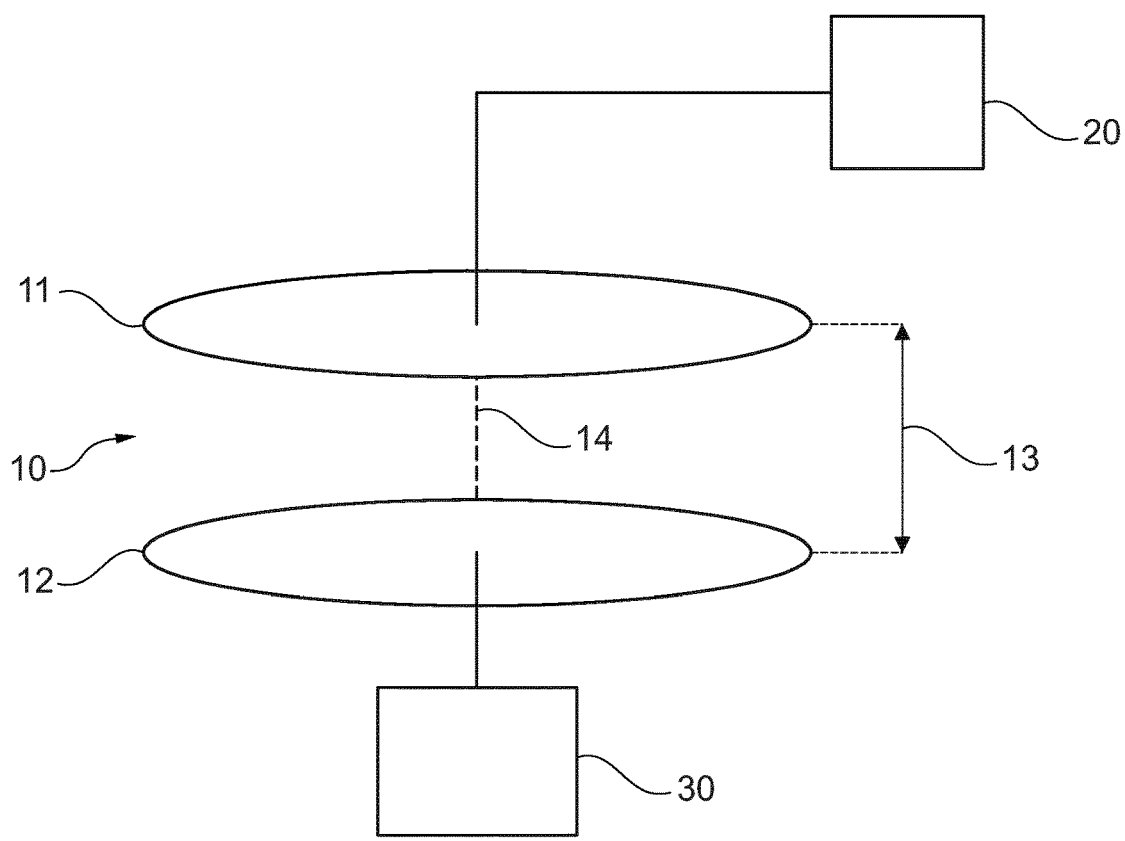
FIG. 1 shows a schematic view of an AC power connector according to an embodiment described herein.

FIG. 1 shows an AC power connector 10 for connecting an AC power supply 20 with a device 30 according to an embodiment described herein. The AC power connector 10 includes at least one first element 11 connectable with the AC power supply 20 and at least one second element 12 connectable with the device 30, the first element 11 and the second elements 12 being arranged at a first distance 13 with respect to each other for defining a capacitance or at least a main portion, e.g. at least 70%, of a capacitance. The at least one first element 11 and the at least one second element 12 are rotatable with respect to each other.

The term "AC" or "AC power" as used herein refers to alternating currents e.g. provided by a power source. In alternating current circuits a periodic reversal of the direction of energy flow occurs. A net transfer of energy in one direction may be referred to as "real power". The term "RF" (radio frequency) as used herein may refer to a frequency range of the AC power. As an example, the term "RF power" may refer to an AC power with a frequency in the range of 9 kHz to 300 GHz, and particularly to AC power having a frequency of 13.56 MHz or 27.12 MHz. The term "MF" (middle frequency) as used herein may refer to an AC power with a frequency in the range of 1 kHz to 3 MHz, e.g. 10 kHz to 0.5 MHz.

The at least one first element 11 and the at least one second element 12 form a capacitor having the defined capacitance or electrical capacity. The at least one first element 11 and the at least one second element 12 have an impedance, i.e., the vector sum of reactance and resistance describing a phase difference and a ratio of amplitudes between, for example sinusoidally, varying voltage and, for example sinusoidally, varying current (alternating current, AC) at a given frequency (e.g. RF, MF etc). On the one hand, the impedance decreases with increasing capacitance and increasing frequency. Thus, a higher-frequency signal or a larger capacitance leads to lower voltage per current. On the other hand, for low frequencies, the reactance is high, so that those frequencies are filtered out. The impedance is inversely proportional to the defining characteristic of the capacitor, i.e., the capacitance. Thus, the AC power connector, which may be a rotary feed-through, allows transport of e.g. high frequency power by providing capacitive coupling. As an example, in sputtering systems using rotatable targets, the AC power connector could be used to bring RF power to the rotatable target, and particularly through a wall or wall portion of a vacuum chamber accommodating the rotatable target.

According to some embodiments, which could be combined with other embodiments described herein, the at least one first element 11 and the at least one second element 12 are coaxially rotatable with respect to each other. In the example of FIG. 1, the first element 11 and the second element 12 are coaxially rotatable about a rotation axis 14. In some embodiments, the rotation axis 14 is an axis of symmetry of the first element 11 and/or the second element 12. As shown in FIG. 1, the first element 11 and the second element 12 may have a circular shape, and may particularly be circular plates, wherein the rotation axis 14 typically passes through a center of said circular shaped elements 11, 12.

According to some embodiments, which could be combined with other embodiments described herein, the at least one first element 11 and the at least one second element 12 are or include plates. The first distance 13 between said plates may then—together with an area of said plates— define the capacitance or electrical capacity, which is proportional to a ratio of the area to the first distance.

In some implementations, the area of each plate is in the range of 200 to 1500 $cm^2$, in the range of 500 to 1200 $cm^2$, in the range of 800 to 900 $cm^2$, and particularly about 850 $cm^2$. In some embodiments, the first distance is in the range of 1 to 10 mm, in the range of 1 to 5 mm, in the range of 1 to 2 mm, and particularly about 1.5 mm. Using such a configuration, an AC power of about 10 kW can be transferred from the AC power source 20 to the device 30. This example may be suitable for device which is a rotatable (cylindrical) target or cathode with a length of 1.35 m and a diameter of about 130 mm.

As an example, when the area is about 850 $cm^2$ and the first distance is about 1.5 mm, a capacitance of about 500 pF can be obtained. Using such a configuration, an AC power of about 10 kW can be transferred from the AC power source 20 to the device 30. In some embodiments, the capacitance provided by the first element and the second element is in the range of 1 to 2000 nF, in the range of 100 to 1000 nF, or in the range of 400 to 600 nF. In some embodiments, the capacitance provided by the first element and the second element is in the range of 1 to 5000 pF, in the range of 10 to 2000 pF, in the range of 100 to 1000 pF, in the range of 400 to 600 pF, or is particularly about 500 pF.

According to some embodiments, which could be combined with other embodiments described herein, the first distance 13 is changeable. Thereby, the capacitance or electrical capacity can be adjusted or adapted to a transmission of e.g. different power or power values. In some implementations, the first distance could be changed manually or automatically, e.g., by using a motor such as a stepper motor.

In some embodiments, the at least one first element 11 and the at least one second element 12 are circular or round (see FIG. 1). As an example, the at least one first element 11 and the at least one second element 12 are or include circular or round plates. However, the shape of the first element 11 and the second element 12 is not limited to circular or round shapes, and could be any two-dimensional or three-dimensional shape (see, e.g., FIGS. 2 to 7) suitable for defining a capacitance between the first element 11 and the second element 12. As an example, the first element 11 and the second element 12 may have a rectangular, oval or square shape. In some embodiments, the first element 11 and the second element 12 may have different shapes. As an example, the first element 11 could be circular, and the second element 12 could be rectangular. The area defining the capacitance may then be an overlap area of the first element and the second element.

In some implementations, the at least one first element 11 is connectable to the AC power supply 20, which may be a RF power supply. As an example, the RF power supply may provide AC or RF power with a frequency of 13.56 MHz or 27.12 MHz.

According to some embodiments, which could be combined with other embodiments described herein, the at least one second element 12 is connectable to the device 30. In some implementations, the device 30 is a rotatable device. For instance, the device 30 may be a rotatable target of a sputtering apparatus. In some embodiments, the AC power connector 10 is configured as a rotary feed-through, and particularly a vacuum rotary feed-through, for transmitting power into a chamber, and particularly a vacuum chamber. When e.g. the rotatable target of a sputtering apparatus is situated in a vacuum chamber, the AC power connector could be provided in or at a wall portion of said vacuum chamber to provide a feed-through for the AC power from the external AC power supply to the rotatable target. The term "vacuum" as used herein may refer to vacuum conditions such as low vacuum, medium vacuum, high vacuum or ultra high vacuum. However, the present embodiments are not limited thereto and a gas could at least temporarily be present in the vacuum chamber, e.g. during a sputtering process. The gas could be a protective gas, a carrier gas, and/or an inert gas, e.g. argon.

According to some embodiments, which could be combined with other embodiments described herein, the at least one first element 11 is fixed in position and the at least one second element 12 is rotatable with respect to the at least one first element 11. In other implementations, the at least one second element 12 is fixed in position and the at least one first element 11 is rotatable with respect to the at least one second element 12. The term "fixed" as used here may refer to a fixed or unchangeable position of the first element 11 with respect to an apparatus, in which the AC power connector is included in or wherein the AC power connector is mounted to, e.g., a sputtering apparatus, and particularly a vacuum chamber of a sputtering apparatus. In yet further embodiments, both elements 11 and 12 are rotatable.

In some implementations, the rotatable first element 11 and/or second element 12 could be configured to rotate with a speed in the range of 1 to 50 rounds per minute, 5 to 30 rounds per minute or 15 to 25 rounds per minute. Typically, the rotatable first element 11 and/or second element 12 could be configured to rotate with a speed of about 20 rounds per minute.

In some embodiments, the device 30 is a rotatable device, and may particularly be a rotatable target of a sputtering apparatus. When the at least one second element 12 is connected to the rotatable device 30, e.g., the rotating target, said at least one second element 12 and rotatable device 30 may rotate together. As an example, a drive (not shown) could be provided to rotate the device or target 30, and the at least one second element 12 could be attached to the device or target 30 so as to rotate along with the device or target 30. In other words, the one drive could be provided to rotate the device and the at least one second element 12. However, also different drives could be provided to respectively rotate the rotatable device and the rotatable element(s) of the AC power connector.

According to some embodiments, which could be combined with other embodiments described herein, the at least one first element 11 and/or the at least one second element 12 include at least one of Ag, Cu and Au.

According to some embodiments, the at least one first element 11 and/or the at least one second element 12 are at least partially coated with at least one of Ag, Cu and Au. Particularly, a depth of penetration of AC (e.g., RF) currents in conductors may be low (skin-effect) and thus, the current flows along the surface of the conductor. As the current does not penetrate the conductor deeply, a good conductivity at the surface is achieved by the coating. For example, the at least one first element 11 and/or the at least one second element 12 can also include stainless steel and be coated with silver, copper or gold. Thereby, aspects like costs and material strength can also be considered.

Figure 2:
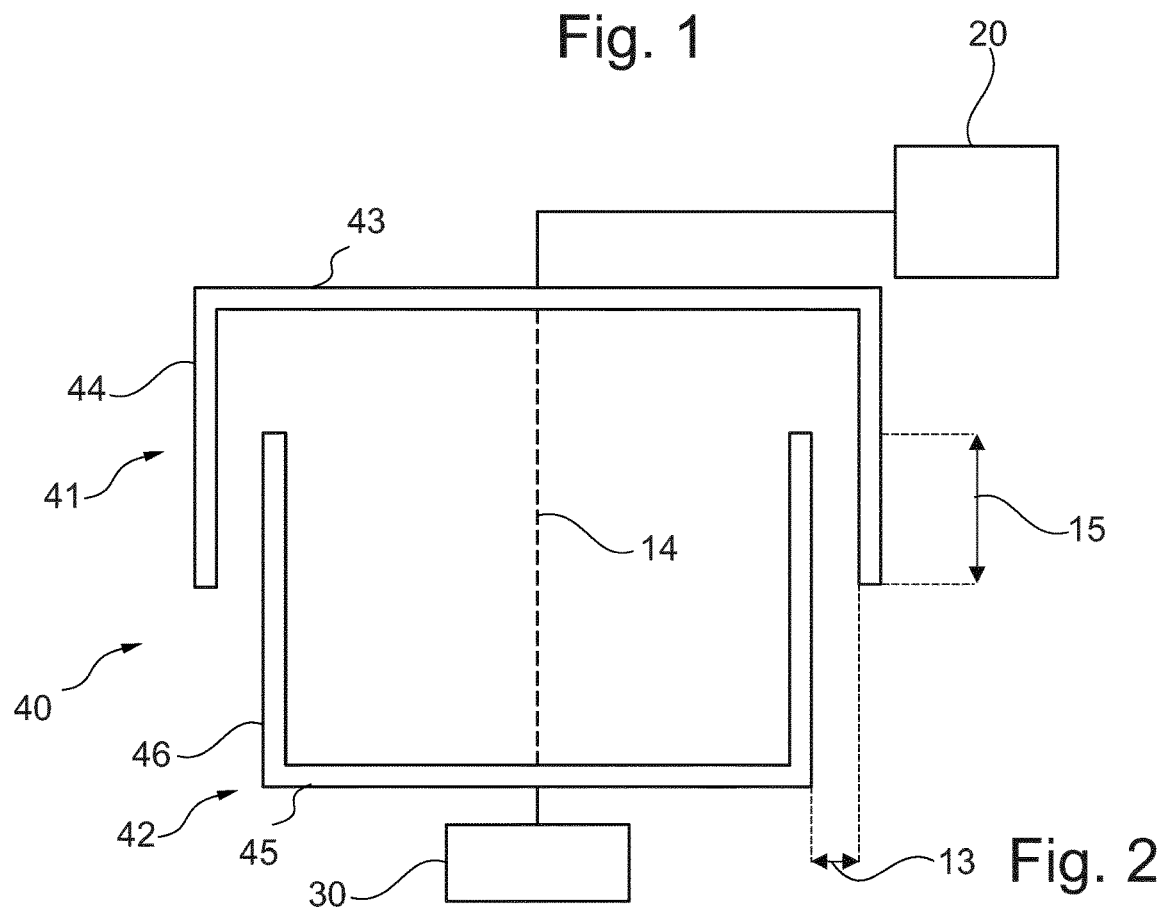
FIG. 2 shows a schematic view of an AC power connector according to another embodiment described herein.

FIG. 2 shows an AC power connector 40 for connecting an AC power supply 20 with a device 30 according to another embodiment described herein.

As shown in FIG. 2, according to some embodiments, the at least one first element 41 is a cylinder element, and the at least one second element 42 is a cylinder element. According to some embodiments, which could be combined with other embodiments described herein, the at least one first element 41 is a hollow cylinder element, and/or the at least one second element 42 is a hollow cylinder element.

In some implementations, and as it is shown in the example of FIG. 2, the first element 41 includes a bottom element or bottom plate 43 and a lateral element 44 providing a lateral surface or cylinder surface of the first element 41. Likewise, the second element 42 includes a bottom element or bottom plate 45 and a lateral element 46 providing a lateral surface or cylinder surface of the second element 42.

In some embodiments, the first element 41 and the second element 42 are nested or interlaced. Particularly, the first element 41 could at least partially be inserted into the second element 42, or the second element 42 could at least partially be inserted into the first element 41 (as it is shown in the example of FIG. 2), providing an overlap of the lateral element 44 of the first element 41 and the lateral element 46 of the second element 42. In FIG. 2, an amount or height of the overlap is denoted with reference numeral 15.

The capacitance or at least a main portion, e.g. at least 70%, of a capacitance of the first element 41 and the second element 42 may particularly be defined by an overlap area of the lateral elements 44, 46 and the first distance 13 between said lateral elements 44, 46. The overlap area is in turn defined by the overlap height 15 and the diameters of the lateral elements 44 and 46. Regarding capacitance, these diameters are the diameters of the opposing surfaces of the lateral elements 44 and 46. In the example of FIG. 2, the diameter of the lateral element 44 is an inner diameter of said lateral element 44, and the diameter of the lateral element 46 is the outer diameter of said lateral element 46. For defining capacitance, the overlap area may be determined using an average diameter of the respective diameters of the lateral elements 44 and 46.

The first distance 13 is the distance between the opposing surfaces of the lateral elements 44 and 46. In some embodiments, the lateral elements 44, 46 or cylinder surfaces of the first element 41 and the second element 42 are arranged coaxially, so that the first distance 13 is constant. When the first distance (also referred to as dark space distance) is kept constant, an occurrence of undesired plasma or plasma spots can be reduced.

In some implementations, the overlap area is in the range of 200 to 1500 cm$^2$, in the range of 500 to 1200 cm$^2$, in the range of 800 to 900 cm$^2$, and particularly about 850 cm$^2$. In some embodiments, the first distance is in the range of 1 to 10 mm, in the range of 1 to 5 mm, in the range of 1 to 2 mm, and particularly about 1.5 mm. In some implementations, an overlap height 15 is in the range of 1 to 500 mm, in the range of 10 to 200 mm, or in the range of 50 to 100 mm. Using such a configuration, an AC power of about 10 kW can be transferred from the AC power source 20 to the device 30.

As an example, when the overlap area is about 850 cm² and the first distance is about 1.5 mm, a capacitance of about 500 pF can be obtained. Using such a configuration, an AC power of about 10 kW can be transferred from the AC power source 20 to the device 30. In some embodiments, the capacitance provided by the first element and the second element is in the range of 1 to 2000 nF, in the range of 100 to 1000 nF, or in the range of 400 to 600 nF. In some embodiments, the capacitance provided by the first element and the second element is in the range of 1 to 5000 pF, in the range of 100 to 1000 pF, in the range of 400 to 600 pF, or is particularly about 500 pF.

According to some embodiments, which could be combined with other embodiments described herein, the overlap height 15 is changeable. Thereby, the capacitance or electrical capacity could be adjusted or adapted to a transmission of e.g. different power or power values. In some implementations, the overlap height could be changed manually or automatically, e.g., by using a motor such as a stepper motor.

Figure 3:
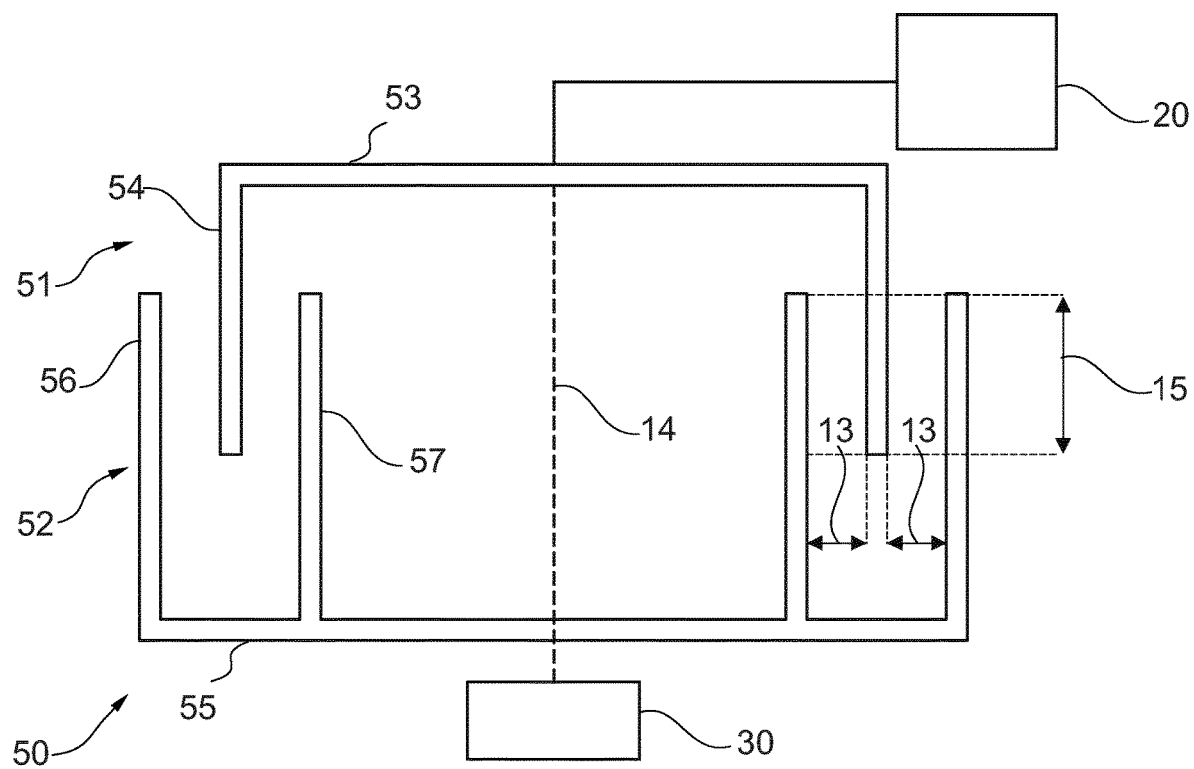
FIG. 3 shows a schematic view of an AC power connector according to yet another embodiment described herein.

FIG. 3 shows a schematic view of an AC power connector 50 according to yet another embodiment described herein. This embodiment is similar to the embodiment described above with reference to FIG. 2, wherein the second element 52 includes two lateral elements 56 and 57. Thus, the description given above also applies to the embodiment of FIG. 3.

As shown in FIG. 3, according to some embodiments, the first element 51 includes a bottom element or bottom plate 53 and a lateral element 54 providing a lateral surface or cylinder surface of the first element 51. The second element 52 includes a bottom element or bottom plate 55 and two lateral elements 56 and 57.

In some embodiments, and as shown in FIG. 3, the first element 51 and the second element 52 are nested or interlaced. Particularly, the first element 51 could at least partially be inserted into the second element 52 (as shown in the example of FIG. 3), or the second element 52 could at least partially be inserted into the first element 51 providing an overlap of the lateral element 54 of the first element 51 and the lateral elements 56 and 57 of the second element 52. In FIG. 2, an amount or height of the overlap is denoted with reference numeral 15.

In some embodiments, the lateral element 54 of the first element 51 is interposed between the two lateral elements 56, 57 of the second element 52. Thereby, the capacitance is particularly provided between the lateral element 54 of the first element 51 and the lateral surface 56 of the second element 52, and between the lateral element 54 of the first element 51 and the lateral element 57 of the second element 52. This nesting allows to increase the capacitance with a minimum increase in the dimension or size of the power connector.

In some embodiments, the lateral element 54 of the first element 51 and the lateral surfaces 56, 57 of the second element 52 are arranged coaxially, so that the first distance 13 is constant between the lateral element 54 of the first element 51 and the one lateral surface 56 of the second element 52 and the lateral element 54 of the first element 51 and the other lateral surface 57 of the second element 52. In some implementations, the first distances 13 between the lateral element 54 of the first element 51 and the one lateral surface 56 of the second element 52 and the lateral element 54 of the first element 51 and the other lateral surface 57 of the second element 52 are equal/the same. However, the first distances 13 between the lateral element 54 of the first element 51 and the one lateral surface 56 of the second element 52 and the lateral element 54 of the first element 51 and the other lateral surface 57 of the second element 52 could be different, too.

According to some embodiments, which could be combined with other embodiments described herein, in sum at least three lateral elements are provided which are nested, and particularly alternately nested. Particularly, the first element could be provided with one lateral element and the second element could be provided with two lateral elements (as it is shown in the example of FIG. 3), or the second element could be provided with one lateral element and the first element could be provided with two lateral elements. However, the present disclosure is not limited to a total of three lateral elements, and any desired number of lateral elements could be provided.

Figure 4:
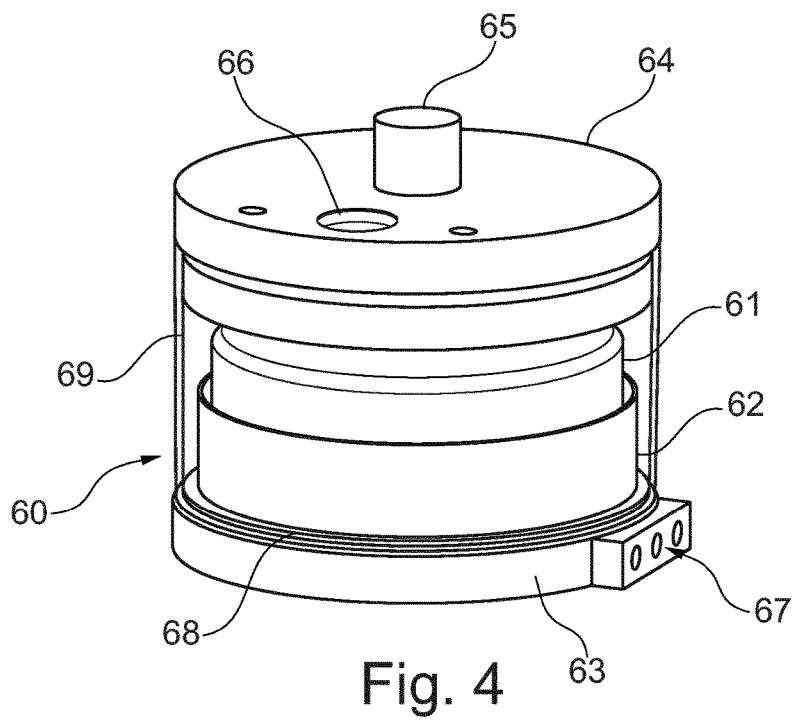
FIG. 4 shows a schematic view of an AC power connector according to a further embodiment described herein.
Figure 5:
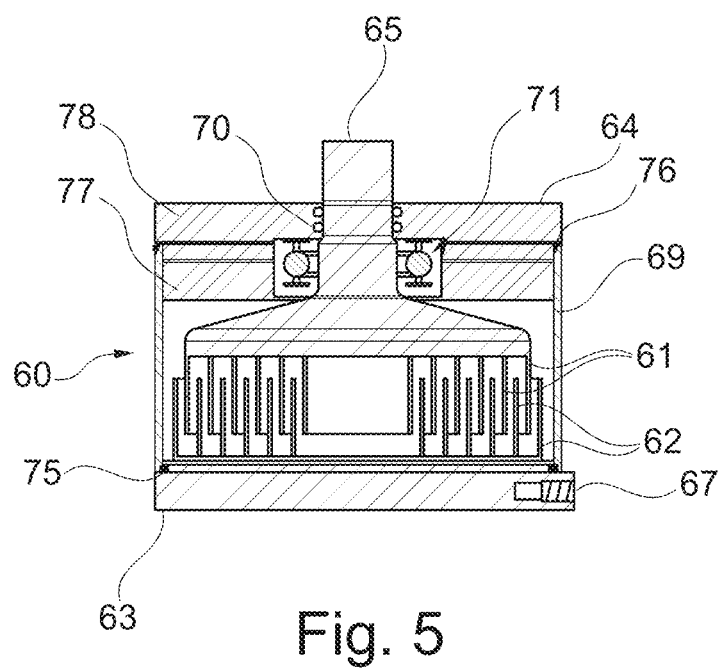
FIG. 5 shows a sectional view of the AC power connector of FIG. 4.

FIG. 4 shows a schematic view of an AC power connector 60 according to still another embodiment described herein, and FIG. 5 shows a sectional view of the AC power connector of FIG. 4. This embodiment is similar to the embodiments described above with reference to FIGS. 2 and 3, wherein the first element 61 includes a plurality of lateral elements and also the second element 62 includes a plurality of lateral elements. The description given above therefore also applies to the embodiment of FIGS. 4 and 5.

As shown in FIG. 4, the AC power connector 60 includes the first element 61 and the second element 62. A connection rod 65 (e.g., a RF connector infeed) is attached to the first element 61. The second element 62 may include a base plate 63 to which the device, e.g. a rotatable target, could be attached or mounted. The base plate 63 may optionally include an AC (RF) output 67.

According to some embodiments, which could be combined with other embodiments described herein, at least the first element and the second element are provided under a vacuum condition. Thereby, arcing can be avoided particularly for high for high AC (RF) power. In some implementations, the AC power connector further includes a vacuum enclosure. The at least one first element and the at least one second element are provided within said vacuum enclosure. In one embodiment, the vacuum enclosure could be configured to rotate together with the rotatable first and/or second element. It is noted that the value of the first distance between the first element and the second element may be chosen in dependence on the vacuum condition, and particularly a vacuum pressure in the vacuum enclosure in which the first element and the second element are located. The term "vacuum" as used herein may refer to vacuum conditions such as low vacuum, medium vacuum, high vacuum or ultra high vacuum. However, the present embodiments are not limited thereto and a gas could be present instead of the vacuum condition between the first element and the second element, i.e. in the enclosure. The gas could be a protective gas or an inert gas, e.g. argon, and/or sulfur hexafluoride ($SF_6$).

According to yet further embodiments, which can be combined with other embodiments described herein, the vacuum chamber, i.e. the processing chamber can have a different vacuum pressure, e.g. 0.3 Pa, and the vacuum enclosure of the connector can have a vacuum pressure of 5.0 E-5 Pa. Yet further, additionally or alternatively, the vacuum enclosure of the connector can be evacuated with a separate vacuum pump.

In the example of FIGS. 4 and 5, the vacuum enclosure or vacuum chamber includes an insulating member 64 and a tubular member 69. The tubular member 69 may include or be made of glass or ceramic, and may particularly be a glass pipe or a ceramic pipe. The insulating member 64 may have a first insulating member 77 and a second insulating member 78. Although in this example the insulating member 64 has the first insulating member 77 and the second insulating member 78, the present embodiments are not limited thereto. Particularly, the insulating member 64 may be a single element, i.e. may be formed of one piece. One end of the tubular member 69 may be in contact with and sealed by the second element 62, e.g., the base plate 63. A first sealing member 75, e.g. an O-ring or quad ring, could be provided between the one end of the tubular member 69 and the second element 62, e.g., the base plate 63. The other end of the tubular member 69 may be in contact with the first insulating member 77. A second sealing member 76, e.g. an O-ring or quad ring, could be provided between the other end of the tubular member 69 and the first insulating member 77.

According to some embodiments, which could be combined with other embodiments described herein, the insulating member 64 includes the first insulating member 77 and the second insulating member 78. The first insulating member 77 and the second insulating member 78 may include or be made of an isolator, e.g., peek ceramic. The first insulating member 77 and the second insulating member 78 may be configured to jointly rotate with the second element 62. A sliding seal 70 could be used to seal off the connection between the second insulating member and the first element 61.

The first insulating member 77, the second insulating member 78 and/or the tubular member 69 may include shadow grooves so as to avoid short circuits of the first element 61 with the second element 62, e.g. with conductive coatings of the first element 61 such as the connection rod. The term "shadow grooves" may refer to covered portions of elements such as the first insulating member 77, the second insulating member 78 or the tubular member 69, which may particularly be covered to prevent sputtering material from being deposited on said covered portions.

According to some embodiments, which could be combined with other embodiments described herein, the first insulating member 77, the second insulating member 78, the tubular member 69 and the second element 62 are configured to jointly rotate with respect to the first element 61. A bearing 71, e.g., a ceramic bearing, could be provided between the first insulating member 77 and the first element 61 to allow a rotation of the first insulating member 77 with respect to the first element 61.

In some implementations, a vacuum connection is provided to allow a connection of a vacuum pump with the vacuum enclosure. As an example, the second insulating member 78 could include an opening 66 configured for a connection with a vacuum pump, such as a separately provided pump or pump of a pumping system of the process chamber, e.g., the sputtering chamber. The term "vacuum" as used herein may refer to vacuum conditions such as low vacuum, medium vacuum, high vacuum or ultra high vacuum. However, the present embodiments are not limited thereto and a gas could be present in the vacuum enclosure. The gas could be a protective gas or an inert gas, e.g. argon, and/or sulfur hexafluoride ($SF_6$).

As shown in FIG. 5, according to some embodiments, the first element 61 includes a plurality of lateral elements (six in FIG. 5) and the second element 52 also includes a plurality of lateral elements (six in FIG. 5). The lateral elements are nested or interlaced so that a capacitance is defined by the opposing sides or (overlapping) surfaces of the lateral elements of the first element 61 and the second element 62. This nesting allows to increase the capacitance with a minimum increase in the dimension or size of the power connector.

In some embodiments, the lateral element 54 of the first element 51 and the lateral surfaces 56, 57 of the second element 52 are arranged coaxially, so that the first distance 13 is constant between the opposing surfaces of the lateral elements of the first element 61 and the lateral elements of the second element 62. In some implementations, the first distance 13 between the opposing surfaces of the lateral elements of the first element 61 and the lateral elements of the second element 62 is the same or equal. However, the respective first distances 13 between the lateral elements of the first element 61 and the lateral elements of the second element 52 could be different, too.

According to some embodiments, which could be combined with other embodiments described herein, a plurality of lateral elements are provided which are nested, and particularly alternately nested. The present disclosure is not limited to a total of 12 lateral elements as shown in FIG. 5, and any desired number of lateral elements could be provided.

Figure 6:
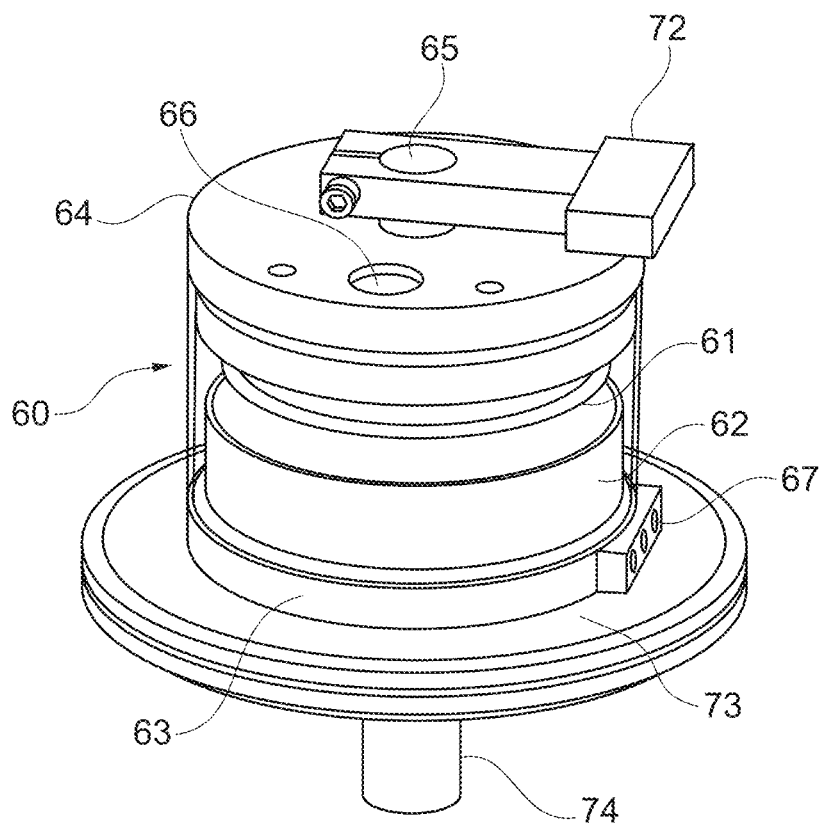
FIG. 6 shows a schematic view of an AC power connector according to still another embodiment described herein.

FIG. 6 shows a schematic view of an AC power connector, which can be used to explain some embodiment described herein. This embodiment is similar to the embodiment described above with reference to FIGS. 4 and 5 and thus, the description given above also applies thereto.

According to some embodiments, which could be combined with other embodiments described herein, the AC power connector 60 includes or is attached to a counter bearing 73. In case of a sputtering apparatus, the counter bearing 73 may be a standard target counter bearing. Provided at the counter bearing is a connector rod 74 for a connection with a magnet or magnetron. In some embodiments, the AC power connector 60 further includes or is attached to an AC power infeed 72, and particularly a RF power infeed.

Figure 7:
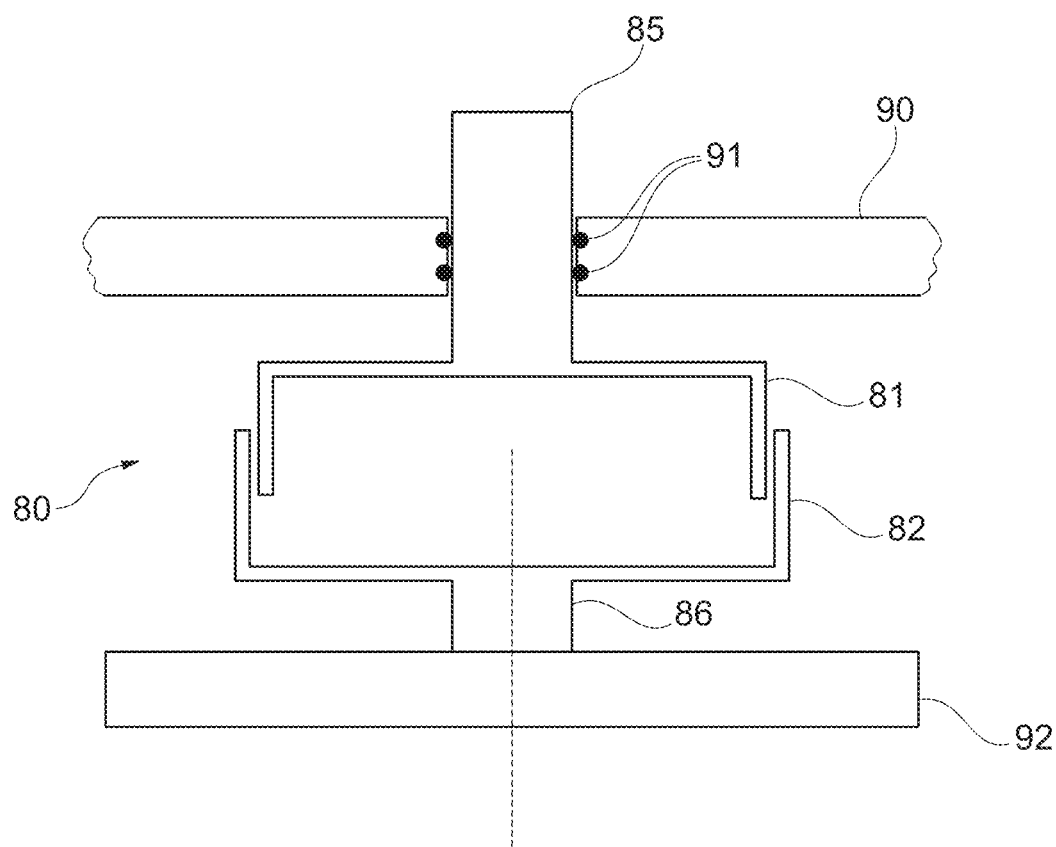
FIG. 7 shows a detailed view of a sputtering apparatus having the AC power connector according to embodiments described herein.

FIG. 7 shows a detailed view of a sputtering apparatus having the AC power connector 80 according to embodiments described herein.

According to some embodiments, which could be combined with other embodiments described herein, the sputtering apparatus for sputter deposition in a vacuum chamber includes a vacuum chamber having a wall portion 81, a rotatable target 92 within the vacuum chamber, an AC power supply for providing AC power to the rotatable target 92, and an AC power connector 80 according to embodiments described herein and provided in the wall portion 90, wherein the at least one first element 81 is connected to the AC power supply and the at least one second element 82 is connected to the rotatable target 92.

In the example of FIG. 7, the AC power connector is configured similarly to the embodiment shown in FIG. 2 and described above. However, the present disclosure is not limited thereto and the power connector of FIG. 7 could be configured according to any one of the embodiments described herein.

As shown in FIG. 7, the sputter apparatus includes the target 92, which may be a rotatable target. The sputter apparatus can also include a magnetron (not shown). A magnetron is a magnet assembly, typically provided by permanent magnets, in order to confine the plasma during sputter deposition. According to some embodiments, the magnetron can be moved in at least one direction over the surface of the target 92.

The RF power supply is connected to the target 92 via AC power connector 80. In some embodiments, RF frequencies are in the range between 5 and 30 MHz, typically 13.56 or 27.12 MHz for sputtering. However, the present embodiments are not limited thereto and other frequencies could be used.

According to some embodiments, which can be combined with other embodiments described herein, the AC power connector 80 may further include a conductor rod 85 attached to the first element 11. In some embodiments, the conductor rod 85 and the first element 11 may be integrally formed, e.g., from the same material. In some implementations, the conductor rod 85 is configured to be inserted in an opening in the wall portion 90. The conductor rod 85 thereby extends from the inside of the vacuum chamber to the outside of the vacuum chamber. According to some examples, the conductor rod 85 can include grooves such that one or more sealing rings 91, e.g. O-rings, can be inserted therein, in order to provide a vacuum seal for a technical vacuum.

According to some embodiments, an insulator (not shown) could be provided between the conductor rod 85 and the wall portion 90. The insulator can include one or more grooves each for receiving a sealing ring. As an alternative to grooves and sealing rings, the conductor rod 85 can have a surface with the roughness configured for providing a vacuum seal.

According to some embodiments, the sputtering apparatus shown in FIG. 7 is for sputter deposition in a vacuum chamber. The sputtering apparatus includes the target 92, which may be a rotatable target. Generally, segmented planar, monolithic planar and rotatable targets may be used for sputtering. Due to the geometry and design of the cathodes, rotatable targets typically have a higher utilization and an increased operation time than planar ones. Accordingly, the use of rotatable targets typically prolongs service lives and reduces costs.

In the example of FIG. 7, the target 92 is connected to the second element 82 via a connection element 86. In some embodiments, the second element 82 and the target 92 are both provided rotatable. Thus, the at least one second element 82 and the rotatable target 92 may rotate together. As an example, a drive (not shown) could be provided to rotate the target 92, and the at least one second element 12 could be attached to the device or target 30 so as to jointly rotate with the target 92. In other words, the one drive could be provided to simultaneously rotate the device 30 and the at least one second element 12.

According to embodiments described herein, the AC power connector includes two or more (cylinder) plates with a good electric conductance (Ag; Cu; Au or with a coating of these). One of them is fixed and the other rotates with e.g. the target. The AC power connector can be configured as feed-through that is under vacuum, wherein the vacuum could be generated by a separate vacuum pump or by the pumping system of the process chamber (the feed-through could be mounted with the target). The distance of the plates may depend on the vacuum and the voltage of the RF-power. The plates may rotate coaxial to each other. The plates may be protected with an isolator, e.g. glass or ceramic. In some implementations, the isolator is protected with a meander shield. The term "vacuum" as used herein may refer to vacuum conditions such as low vacuum, medium vacuum, high vacuum or ultra high vacuum. However, the present embodiments are not limited thereto and a gas could be present in the vacuum enclosure of the connector. The gas could be a protective gas or an inert gas, e.g. argon, and/or sulfur hexafluoride ($SF_6$).

Due to the occurrence of undesired plasma or plasma spots, the power in-feed of the capacitive coupling may be plasma-insulated. Since this may be challenging under vacuum condition due to the required dark space distance, an atmospheric space or chamber could be provided, which may be situated above the AC power connector. In this atmospheric space or chamber the AC (e.g. HF, MF or RF) feed-out could be provided. In some implementations, a compensation of reactive or idle currents could be further provided. Such a compensation may be provided in dependence on a cathode impedance. A connection to the feed-out could than by made using a HF coaxial cable, which may be guided through a metal flexible tube to the outside.

Figure 8:
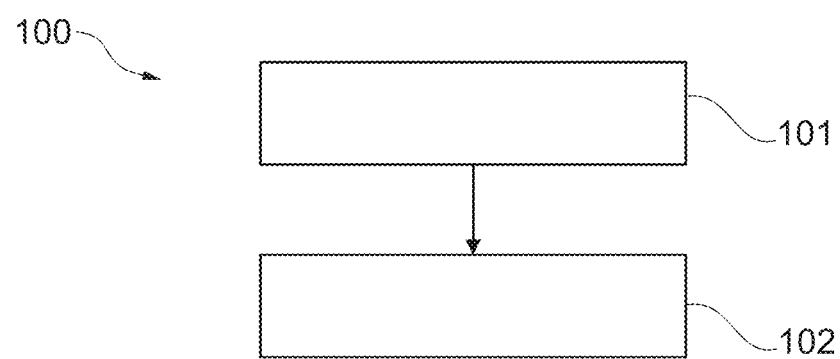
FIG. 8 shows a flowchart of a method for providing AC power from an AC power supply to a device according to embodiments described herein.

FIG. 8 shows a flowchart of a method 100 for providing AC power from an AC power supply to a device according to embodiments described herein.

According to some embodiments, which could be combined with other embodiments described herein, the method 100 includes, in block 101, transferring AC power from the power supply via at least one first element to at least one second element, wherein the at least one first element and the at least one second element are arranged at a first distance with respect to each other, and, in block 102, rotating at least one of the at least one first element and the at least one second element with respect to each other.

While the foregoing is directed to embodiments of the invention, other and further embodiments of the invention may be devised without departing from the basic scope thereof, and the scope thereof is determined by the claims that follow.

The invention claimed is:

1. An AC power connector for connecting an AC power supply with a rotatable target of a sputtering apparatus, the AC power connector being configured as a rotary feed-through for transmitting power into a processing chamber, the AC power connector comprising:
at least one first element connectable with the AC power supply and at least one second element connectable with the rotatable target so as to rotate together with the rotatable target, the first element and the second element being arranged at a first distance with respect to each other for defining a capacitance, wherein the at least one first element and the at least one second element are rotatable with respect to each other, wherein the first element and the second element are configured for a transfer of an AC power between the at least one first element and the at least one second element; and
an enclosure, wherein the at least one first element and the at least one second element are provided within the enclosure, wherein the enclosure is a vacuum enclosure or an enclosure comprising a protective gas or an inert gas.

2. The AC power connector of claim 1, wherein the at least one first element is a cylinder element, and/or wherein the at least one second element is a cylinder element.

3. The AC power connector of claim 2, wherein the at least one first element is a hollow cylinder element, and/or wherein the at least one second element is a hollow cylinder element.

4. The AC power connector of claim 1 including in sum at least three first elements and at least three second elements being nested.

5. The AC power connector of claim 1, wherein the capacitance is in the range of 1 to 5000 nF.

6. The AC power connector of claim 1, wherein the at least one first element and the at least one second element are coaxially rotatable with respect to each other.

7. The AC power connector of claim 1, wherein the enclosure is a vacuum enclosure.

8. The AC power connector of claim 7, wherein at least a part of the vacuum enclosure is provided rotatable with respect to the first element and/or the second element.

9. The AC power connector of claim 1, wherein the at least one first element and/or the at least one second element include at least one of Ag, Cu and Au.

10. The AC power connector of claim 1, wherein the at least one first element and the at least one second element are at least partially surrounded by an insulating member.

11. The AC power connector of claim 1, wherein the AC power connector is configured as a rotary feed-through for transmitting power into a chamber.

12. The power connector of claim 1, wherein the first element includes a plate element and/or wherein the second element includes a plate element.

13. The power connector of claim 1, where the first distance is changeable.

14. The AC power connector of claim 1, further comprising a vacuum chamber and a sputtering apparatus for sputter deposition in the vacuum chamber, the vacuum chamber having:
- a wall portion;
- the rotatable target within the vacuum chamber; and
- an AC power supply for providing AC power to the rotatable target, wherein the AC power connector is provided in the wall portion, wherein the at least one first element is connected to the AC power supply, and wherein the at least one second element is connected to the rotatable target so as to rotate together with the rotatable target.

15. The AC power connector of claim 2, including in sum at least three first and second elements being nested.

16. The AC power connector of claim 3, including in sum at least three first elements and at least three second elements being nested.

17. The AC power connector of claim 2, wherein the capacitance is in the range of 10 to 2000 pF.

18. The AC power connector of claim 3, wherein the capacitance is in the range of 100 to 1000 nF.

19. The AC power connector of claim 4, wherein the capacitance is in the range of 400 to 600 nF.

20. The AC power connector of claim 1, wherein in sum at least three lateral elements are provided which are nested, wherein (i) the first element includes at least one lateral element and the second element includes at least two lateral elements, (ii) the second element includes at least one lateral element and the first element includes at least two lateral elements, or (iii) the first element includes a plurality of lateral elements and the second element includes a plurality of lateral elements,
wherein the at least three lateral elements are substantially parallel to a rotation axis of the AC power connector.

21. The AC power connector of claim 1, further comprising a base plate for mounting the AC power connector to the rotatable target.

22. The AC power connector of claim 1, wherein the enclosure comprises an insulating member and a tubular member, and wherein the insulating member, the tubular member, and the second element are configured to jointly rotate with respect to the first element.

* * * * *